United States Patent
Chen et al.

(10) Patent No.: US 12,072,236 B2
(45) Date of Patent: Aug. 27, 2024

(54) LIGHT SENSING MODULE AND ELECTRONIC DEVICE USING THE SAME

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Bo-Jhih Chen, New Taipei (TW); Zi-Jun Lin, Taipei (TW); Kuo-Ming Chiu, New Taipei (TW); Yung-Chang Jen, New Taipei (TW); Meng-Sung Chou, New Taipei (TW); Chang-Hung Hsieh, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 18/187,545

(22) Filed: Mar. 21, 2023

(65) Prior Publication Data
US 2023/0228620 A1 Jul. 20, 2023

Related U.S. Application Data

(62) Division of application No. 17/095,078, filed on Nov. 11, 2020, now Pat. No. 11,644,360.
(Continued)

(30) Foreign Application Priority Data
Sep. 23, 2020 (CN) .......................... 202011012537.1

(51) Int. Cl.
*G01J 1/08* (2006.01)
*F21V 5/00* (2018.01)
(Continued)

(52) U.S. Cl.
CPC ................ *G01J 1/08* (2013.01); *F21V 5/007* (2013.01); *F21V 17/101* (2013.01);
(Continued)

(58) Field of Classification Search
CPC ... G01J 1/08; G01J 1/0474; G01J 1/42; F21V 5/007; F21V 17/101; G03B 21/145;
(Continued)

(56) References Cited

U.S. PATENT DOCUMENTS

2016/0240721 A1* 8/2016 Chu ....................... G01J 1/0214

* cited by examiner

*Primary Examiner* — Tony Ko
(74) *Attorney, Agent, or Firm* — Li & Cai Intellectual Property (USA) Office

(57) ABSTRACT

A light sensing module includes a substrate, a light sensing unit, a first light-transmissive component, and a light shielding layer. The light sensing unit is disposed on the substrate to sense an intensity of a working light beam, and has an upper light receiving surface and a lateral surface perpendicular to the upper light receiving surface. The first light-transmissive component covers the light sensing unit, and has a first refractive index between a refractive index of the light sensing unit and a refractive index of air. The light shielding layer surrounds the lateral surface and is covered by the first light-transmissive component.

16 Claims, 9 Drawing Sheets

Related U.S. Application Data

(60) Provisional application No. 62/935,671, filed on Nov. 15, 2019.

(51) Int. Cl.
| | |
|---|---|
| *F21V 17/10* | (2006.01) |
| *G01J 1/04* | (2006.01) |
| *G01J 1/42* | (2006.01) |
| *G03B 21/14* | (2006.01) |
| *G03B 21/26* | (2006.01) |
| *H05B 35/00* | (2006.01) |
| *F21K 9/90* | (2016.01) |
| *F21Y 105/16* | (2016.01) |
| *F21Y 113/10* | (2016.01) |
| *G03B 21/20* | (2006.01) |

(52) U.S. Cl.
CPC ............... *G01J 1/0474* (2013.01); *G01J 1/42* (2013.01); *G01J 1/4257* (2013.01); *G03B 21/145* (2013.01); *G03B 21/26* (2013.01); *H05B 35/00* (2013.01); *F21K 9/90* (2013.01); *F21Y 2105/16* (2016.08); *F21Y 2113/10* (2016.08); *G03B 21/2033* (2013.01)

(58) Field of Classification Search
CPC .... G03B 21/26; G03B 21/2033; G03B 29/00; G03B 21/001; G03B 21/14; H05B 35/00; F21K 9/90; F21Y 2105/16; F21Y 2113/10; A47L 15/4293; D06F 34/32; G02B 27/18
See application file for complete search history.

LIGHT SENSING MODULE AND ELECTRONIC DEVICE USING THE SAME

CROSS-REFERENCE TO RELATED PATENT APPLICATION

This application is a divisional application of the U.S. application Ser. No. 17/095,078, filed on Nov. 11, 2020 and entitled "LIGHT SENSING MODULE AND ELECTRONIC DEVICE USING THE SAME", now pending, the entire disclosures of which are incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light sensing technique and applications thereof, and more particularly to a light sensing module and an electronic device using the same, such as a portable electronic device or a wearable electronic device.

BACKGROUND OF THE DISCLOSURE

With the emphasis on public health awareness, leisure sports have become more and more popular. This has contributed to acceleration in the development and popularization of wearable devices. Compared to mobile phones, the wearable devices have the advantages of being compact and lightweight, and are therefore suitable for use when exercising or being on the move. In addition to having the functions of displaying time and providing notifications, the wearable devices can also monitor instant physiological signals such as pulse signals in real time, such that consumers can be made aware of their own physiological states at all times.

A common way of monitoring physiological signals is through a light sensor, although many inadequacies are still associated therewith in actual use. In the use of the conventional wearable devices, the quality of monitored physiological signals may be negatively affected by a user's skin color, a brightness of the environment, a proper or improper fit of wearing the device, and a user's exercise state. That is, the interference (crosstalk) resulted from such factors may affect the interpretation of weak physiological signals that are measured, and even completely cover over the measured weak physiological signals. For example, when a user is exercising vigorously in an outdoor environment, the monitoring performance of a light sensor of physiological signals would be negatively affected by the strong sunlight. In addition, a large range of motion or a vigorous degree of exercise can easily affect the fit between a wearable device and a human body, thus affecting the calculation of physiological values. If a user changes his/her exercise intensity according to an inaccurate physiological value, he/she may suffer serious injury. On the other hand, since the wearable devices are generally designed to be multi-functional, lightweight, and handy, there are inevitable restrictions in size and location of a space required for arranging the light sensor. This may cause a light receiving area of the light sensor to be limited in range, thus affecting the calculation of the physiological values. As a result, it can be difficult to perform a complete assessment of a physiological state.

Therefore, in order to allow a user to accurately read his/her physiological values in indoor and outdoor environments and in various exercise conditions, it is an important and urgent issue in modern society to develop a light sensing device that can effectively reduce optical interference and increase monitoring sensitivity.

SUMMARY OF THE DISCLOSURE

In response to the above-referenced technical inadequacies, the present disclosure provides a light sensing module having good sensitivity and accuracy, and an electronic device using the same.

In order to solve the above-mentioned problems, one of the technical aspects adopted by the present disclosure is to provide a light sensing module that includes a substrate, a light sensing unit, a first light-transmissive component, and a light shielding layer. The light sensing unit is disposed on the substrate to sense an intensity of a working light beam, and has an upper light receiving surface and a lateral surface perpendicular to the upper light receiving surface. The first light-transmissive component covers the light sensing unit, and has a first refractive index between a refractive index of the light sensing unit and a refractive index of air. The light shielding layer surrounds the lateral surface and is covered by the first light-transmissive component.

In one of the possible or preferred embodiments, the light sensing module further includes a blocking wall being disposed on the substrate and surrounding the light sensing unit and the first light-transmissive component. The lateral surface and the blocking wall have a gap therebetween that is filled with the light shielding layer.

In one of the possible or preferred embodiments, an upper surface of the light shielding layer is flush with the upper light receiving surface.

In one of the possible or preferred embodiments, the blocking wall has a light transmittance of less than 2% with respect to the working light beam.

In one of the possible or preferred embodiments, the blocking wall has a thickness between 50 µm and 200 µm.

In one of the possible or preferred embodiments, the light sensing module further includes a second light-transmissive component that is disposed between the light sensing unit and the first light-transmissive component and has a second refractive index between the refractive index of the light sensing unit and the first refractive index.

In one of the possible or preferred embodiments, the first light-transmissive component has a thickness between 30 µm and 50 µm, and the second light-transmissive component has a thickness between 10 µm and 30 µm.

In one of the possible or preferred embodiments, the first refractive index of the first light-transmissive component is between 1.45 and 1.5, and the second refractive index of the second light-transmissive component is between 1.54 and 1.55.

In one of the possible or preferred embodiments, the light shielding layer has a light transmittance of less than 2% with respect to the working light beam.

In one of the possible or preferred embodiments, the light sensing module further includes a third light-transmissive component that surrounds the first light-transmissive component and has a third refractive index of less than the first refractive index.

In one of the possible or preferred embodiments, the third light-transmissive component has a thickness between 10 μm and 30 μm.

In one of the possible or preferred embodiments, the third refractive index of the third light-transmissive component is between 1.35 and 1.45.

In one of the possible or preferred embodiments, the third light-transmissive component contains light diffusing particles.

In one of the possible or preferred embodiments, the light diffusing particles have an average particle diameter between 10 nm and 30 nm, and are present in an amount between 0.01 wt % and 1 wt % based on 100 wt % of the third light-transmissive component.

In one of the possible or preferred embodiments, the light sensing unit has a first electrode at a bottom portion thereof and a second electrode at a top portion thereof. The substrate has a first contact pad and a second contact pad that are separate from each other. The first electrode is bonded to the first contact pad, and the second electrode is electrically connected to the second contact pad via a wire.

In order to solve the above-mentioned problems, one of the technical aspects adopted by the present disclosure is to provide an electronic device, including a light emitting module and the light sensing module having the above-mentioned structure. The light emitting module is configured to emit a working light beam, and the light sensing module is configured to sense an intensity of the working light beam.

Therefore, the light sensing module of the present disclosure, in which the first light-transmissive component covers the light sensing unit and has a first refractive index that is between a refractive index of the light sensing unit and a refractive index of air, and the blocking wall is disposed on the substrate and surrounds the light sensing unit and the first light-transmissive component, has the following beneficial effects. The sensing range can be expanded, the blind spot can be reduced, and the crosstalk of external lights on the light sensing unit can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
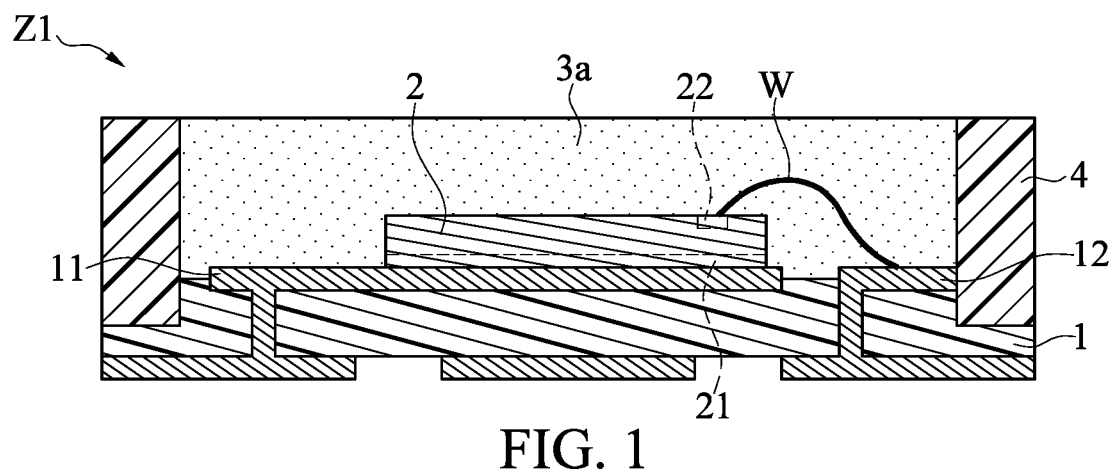
FIG. 1 is a structural schematic view of a light sensing module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, a first embodiment of the present disclosure provides a light sensing module Z1, which includes a substrate 1, a light sensing unit 2, a first light-transmissive component 3a and a blocking wall 4. The light sensing unit 2 is disposed on the substrate 1. The first light-transmissive component 3a covers the light sensing unit 2. The blocking wall 4 is disposed on the substrate 1 and surrounds the light sensing unit 2 and the first light-transmissive component 3a.

In the present embodiment, the light sensing unit 2 can be arranged in an electronic device (e.g., a wearable electronic device) through the substrate 1 to sense an intensity of a working light beam. Accordingly, the electronic device can perform a desired action according to a sensing result, such as measuring a physiological signal of a user. Furthermore, the first light-transmissive component 3a has a first refractive index that is between a refractive index of the light sensing unit 2 and a refractive index of air, so as to realize a refractive index matching function. Therefore, a sensing range of the light sensing unit 2 can be expanded, and a blind spot of the light sensing unit 2 can be reduced. The blocking wall 4 has low light transmittance so as to reduce the crosstalk of external lights on the light sensing unit 2. Therefore, the sensitivity and accuracy of the light sensing unit 2 can be significantly improved. As used herein, the term "refractive index of light sensing unit 2" refers to a matching refractive index of a portion of the light sensing unit 2 that is in contact with the first light-transmissive component 3a.

In practice, the substrate 1 can be a circuit board with a plurality of inner connecting interfaces and a plurality of outer connecting interfaces. The light sensing unit 2 can be a photodetector chip and can work with a light emitting unit (not shown). The light emitting unit is configured to emit a working light beam such as a visible or invisible light beam. The light sensing unit 2 is configured to receive the working light beam, and to generate a current corresponding to the intensity of the working light beam. The first light-transmissive component 3a can be a layered structure that is formed of, for example, a silicone-based resin. Furthermore, the refractive index (i.e., the first refractive index) of the first light-transmissive component 3a can be between 1.45 and 1.5, and is preferably 1.5. The thickness of the first light-transmissive component 3a can be between 30 μm and 50 μm. The blocking wall 4 can be formed of a resin composition including a silicone-based resin and a black carbon powder (K Black). The blocking wall 4 can be fixed on the substrate 1 by an adhesive layer (not shown). In the present embodiment, a bottom portion of the blocking wall 4 extends into the substrate 1 so as to realize a better light blocking effect. The above-described details are merely exemplary, and are not intended to limit the present disclosure. In an embodiment that is not shown, the blocking wall 4 can be integrated on a surface of the substrate 1.

More specifically, the inner connecting interfaces of the substrate 1 include a first contact pad 11 and a second contact pad 12 which are separated from each other. The light sensing unit 2 can be electrically connected to the first contact pad 11 and the second contact pad 12 by any suitable means, which depends on the form of the light sensing unit 2. For example, the light sensing unit 2 has a first electrode 21 at a bottom portion thereof and a second electrode 22 at a top portion thereof, as shown in FIG. 1. The light sensing unit 2 can be bonded to the first contact pad 11 of the substrate 1 by a die attach adhesive or soldering material, in which the first electrode 21 is electrically connected to the first contact pad 11, and the second electrode 22 can be electrically connected to the second contact pad 12 by a wire W. In consideration of costs and product reliability, the blocking wall 4 has a light transmittance to the working light beam of preferably less than 2%, and has a thickness of preferably between 50 μm and 200 μm.

Second Embodiment

Figure 2:
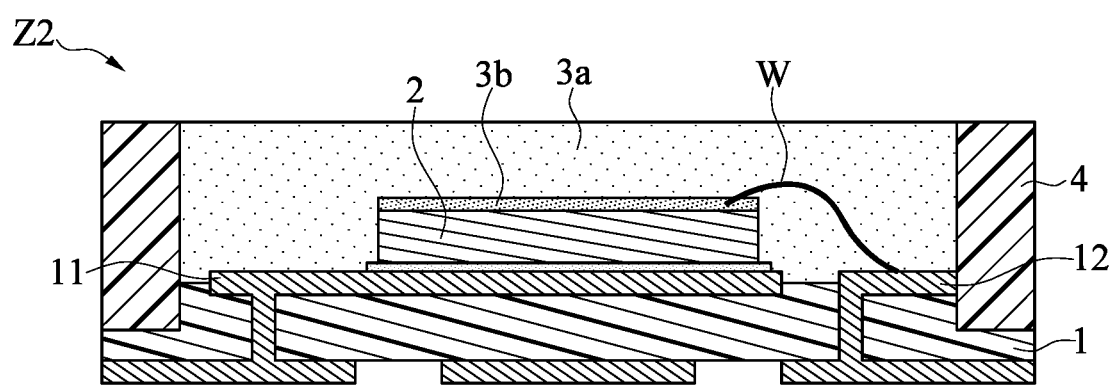
FIG. 2 is a structural schematic view of a light sensing module according to a second embodiment of the present disclosure.

Referring to FIG. 2, a second embodiment of the present disclosure provides a light sensing module Z2, which includes a substrate 1, a light sensing unit 2, a first light-transmissive component 3a, a second light-transmissive component 3b and a blocking wall 4. The light sensing unit 2 is disposed on the substrate 1. The first light-transmissive component 3a covers the light sensing unit 2. The second light-transmissive component 3b is disposed between the light sensing unit 2 and the first light-transmissive component 3a. The blocking wall 4 is disposed on the substrate 1, and surrounds the light sensing unit 2, the first light-transmissive component 3a and the second light-transmissive component 3b. The technical details of the substrate 1, the light sensing unit 2, the first light-transmissive component 3a and the blocking wall 4 have been described in the first embodiment, and will not be reiterated herein.

In the present embodiment, the first light-transmissive component 3a has a first refractive index that is between a refractive index of the light sensing unit 2 and a refractive index of air. The second light-transmissive component 3b has a second refractive index that is between the refractive index of the light sensing unit 2 and the first refractive index. Therefore, the first light-transmissive component 3a and the second light-transmissive component 3b can jointly realize a refractive index matching function to further increase the sensitivity of the light sensing unit 2. In practice, the second light-transmissive component 3b can be formed of a silicone-based resin. Furthermore, the refractive index (i.e., the second refractive index) of the second light-transmissive component 3b can be between 1.54 and 1.55, and is preferably 1.55. The thickness of the second light-transmissive component 3b can be between 10 μm and 30 μm. More specifically, the light sensing unit 2 has an upper light receiving surface 201 and a lateral surface 202 perpendicular to the upper light receiving surface 201. The second light-transmissive component 3b is a film that is shaped in advance and then attached to the upper light receiving surface 201 of the light sensing unit 2. Also, the second light-transmissive component 3b can be formed on the upper light receiving surface 201 of the light sensing unit 2 by coating and curing. The above-described details are merely exemplary, and are not intended to limit the present disclosure.

Third Embodiment

Figure 3:
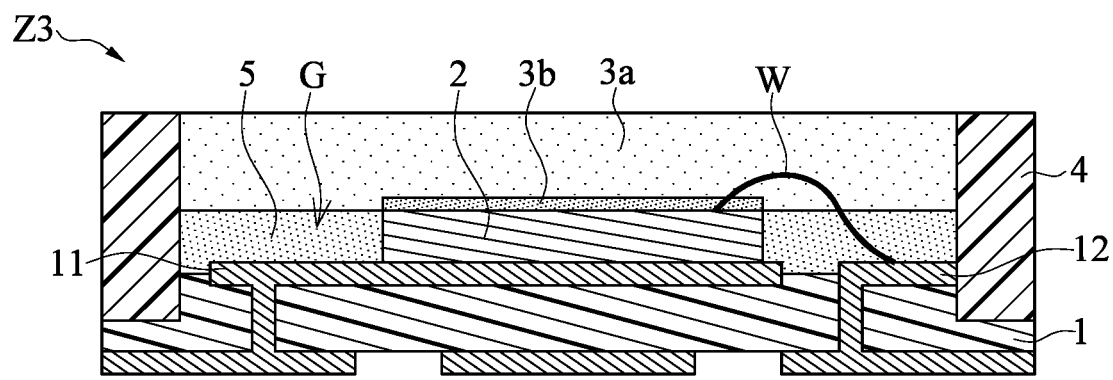
FIG. 3 is a structural schematic view of a light sensing module according to a third embodiment of the present disclosure.

Referring to FIG. 3, a third embodiment of the present disclosure provides a light sensing module Z3, which includes a substrate 1, a light sensing unit 2, a first light-transmissive component 3a, a second light-transmissive component 3b, a blocking wall 4 and a light shielding layer 5. The light sensing unit 2 is disposed on the substrate 1. The light shielding layer 5 is disposed on the substrate 1 and surrounds the light sensing unit 2. The first light-transmissive component 3a covers the light sensing unit 2 and the light shielding layer 5. The second light-transmissive component 3b is disposed between the light sensing unit 2 and the first light-transmissive component 3a. The blocking wall 4 is disposed on the substrate 1, and surrounds the light sensing unit 2, the first light-transmissive component 3a, the second light-transmissive component 3b and the light shielding layer 5. The technical details of the substrate 1, the light sensing unit 2, the first light-transmissive component 3a, the second light-transmissive component 3b and the blocking wall 4 have been described in the aforesaid embodiments, and will not be reiterated herein.

In the present embodiment, the light shielding layer 5 is disposed between the light sensing unit 2 and the blocking wall 4. The light shielding layer 5 also has low light transmittance and can work with the blocking wall 4 to jointly realize an external light shielding function. Therefore, in the presence of the light shielding layer 5, the crosstalk of external lights on the light sensing unit 2 can be decreased. As a result, the light sensing unit 2 has a higher accuracy and can thus greatly reduce misjudgment rate. In practice, a lateral surface 202 of the light sensing unit 2 and the blocking wall 4 has a gap G therebetween, which can be completely or partially filled with the light shielding layer 5. Preferably, the gap G is completely filled with the light shielding layer 5. The light shielding layer 5 can be formed of, for example, a resin composition including a silicone-based resin and a black carbon powder (K Black). The above-described details are merely exemplary, and are not intended to limit the present disclosure.

Fourth Embodiment

Figure 4:
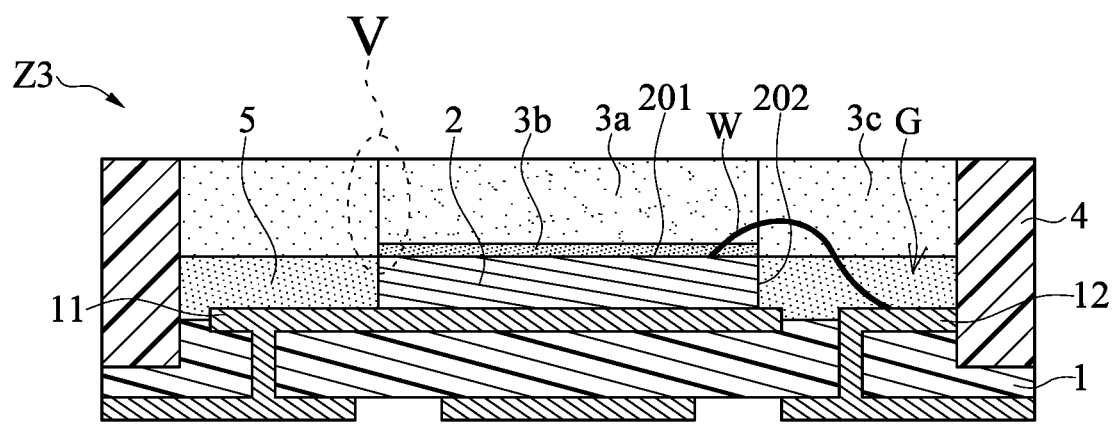
FIG. 4 is a structural schematic view of a light sensing module according to a fourth embodiment of the present disclosure.

Referring to FIG. 4, a fourth embodiment of the present disclosure provides a light sensing module Z4, which includes a substrate 1, a light sensing unit 2, a first light-transmissive component 3a, a second light-transmissive component 3b, a third light-transmissive component 3c, a blocking wall 4 and a light shielding layer 5. The light sensing unit 2 is disposed on the substrate 1. The light shielding layer 5 is disposed on the substrate 1 and surrounds the light sensing unit 2. The first light-transmissive component 3a covers the light sensing unit 2. The second light-transmissive component 3b is disposed between the light sensing unit 2 and the first light-transmissive component 3a. The third light-transmissive component 3c surrounds the first light-transmissive component 3a, and corresponds in position to the light shielding layer 5. The blocking wall 4 is disposed on the substrate 1, and surrounds the light sensing unit 2, the first light-transmissive component 3a, the second light-transmissive component 3b, the third light-transmissive component 3c and the light shielding layer 5. The technical details of the substrate 1, the light sensing unit 2, the first light-transmissive component 3a, the second light-transmissive component 3b, the blocking wall 4 and the light shielding layer 5 have been described in the aforesaid embodiments, and will not be reiterated herein.

In the present embodiment, the first light-transmissive component 3a has a first refractive index that is between a refractive index of the light sensing unit 2 and a refractive index of air. The second light-transmissive component 3b has a second refractive index that is between the refractive index of the light sensing unit 2 and the first refractive index. The third light-transmissive component 3c has a third refractive index that is less than the first refractive index. Therefore, the first light-transmissive component 3a and the third light-transmissive component 3c can jointly realize a refractive index matching function to further increase the sensitivity of the light sensing unit 2, the related details of which are described below. In practice, the third light-transmissive component 3c can be a layered structure that is formed of, for example, a silicone-based resin. Furthermore, the refractive index (i.e., the third refractive index) of the third light-transmissive component 3c can be between 1.35 and 1.45, and preferably 1.4. The thickness of the third light-transmissive component 3c can be between 10 μm and 30 μm. The above-described details are merely exemplary, and are not intended to limit the present disclosure.

Figure 5:
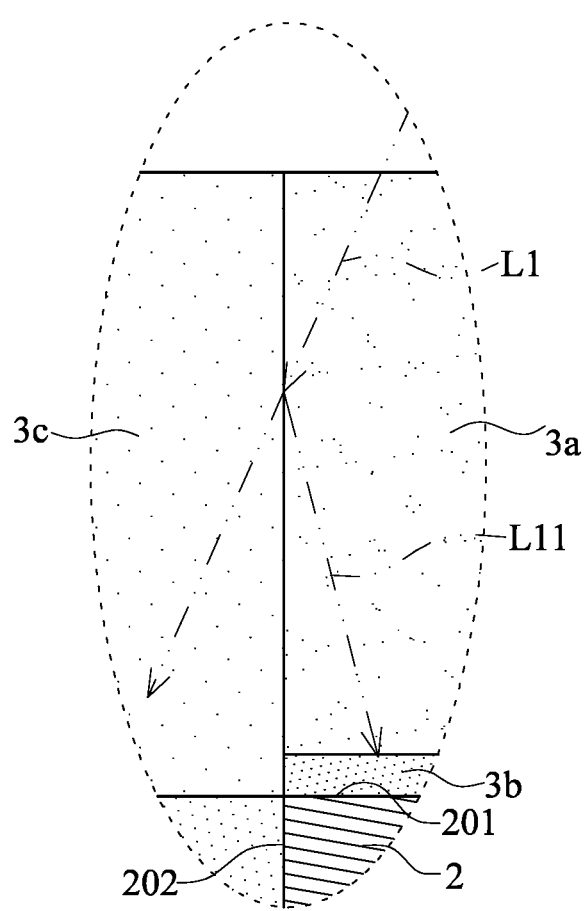
FIG. 5 is an enlarged view of part V of FIG. 4.

Reference is now made to FIG. 5. In use of the structure as described in the present embodiment, in which the refractive index of the third light-transmissive component 3c is less than the refractive index of the first light-transmissive component 3a, although a portion of a working light beam L1 is radiated to the third light-transmissive component 3c rather than directly entering a sensing range of the light sensing unit 2, the working light beam L1 can undergo a total reflection at a boundary between the first light-transmissive component 3a and the third light-transmissive component 3c, so as to be received by the upper light receiving surface 201 or the lateral surface 202 of the light sensing unit 2. That is, the sensing range of the light sensing unit 2 can be increased by the refractive index matching function that is jointly realized by the first light-transmissive component 3a and the third light-transmissive component 3c.

Fifth Embodiment

Figure 6:
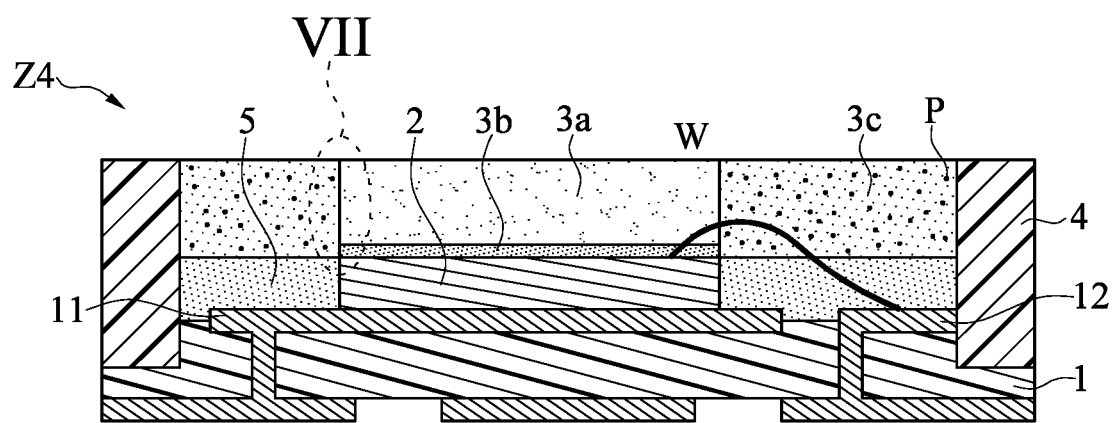
FIG. 6 is a structural schematic view of a light sensing module according to a fifth embodiment of the present disclosure.
Figure 7:
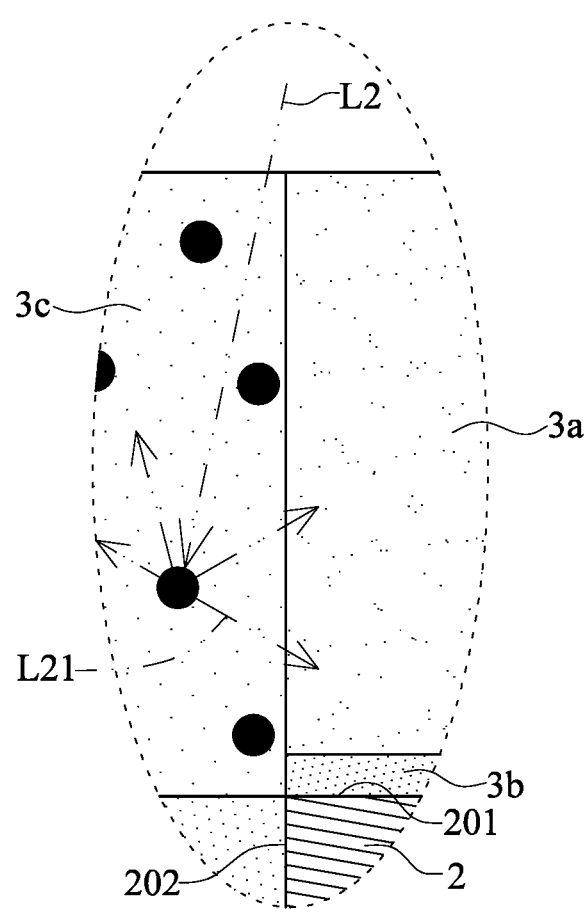
FIG. 7 is an enlarged view of part VII of FIG. 6.
Figure 8:
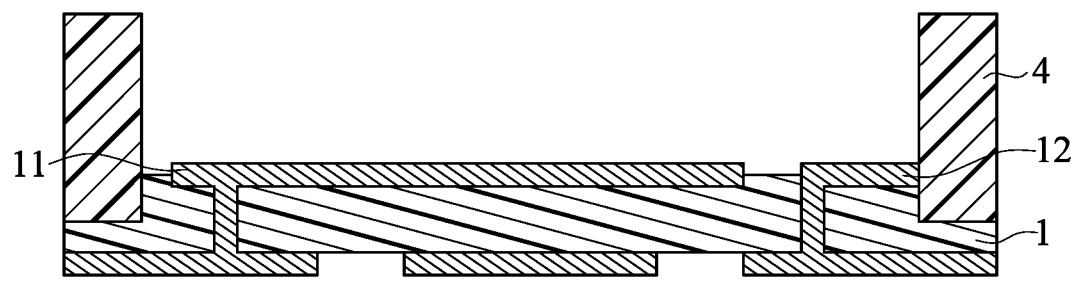
FIG. 8 to FIG. 13 are schematic views showing manufacturing steps of the light sensing module according to the fifth embodiment of the present disclosure.
Figure 9:
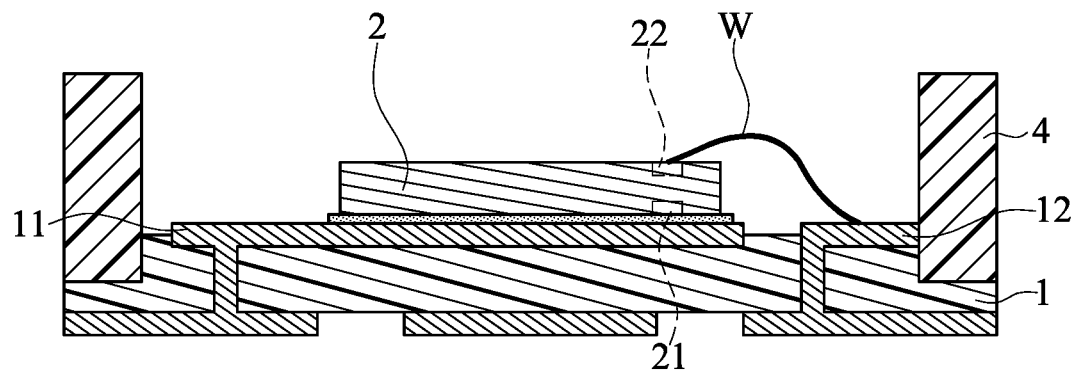
Figure 10:
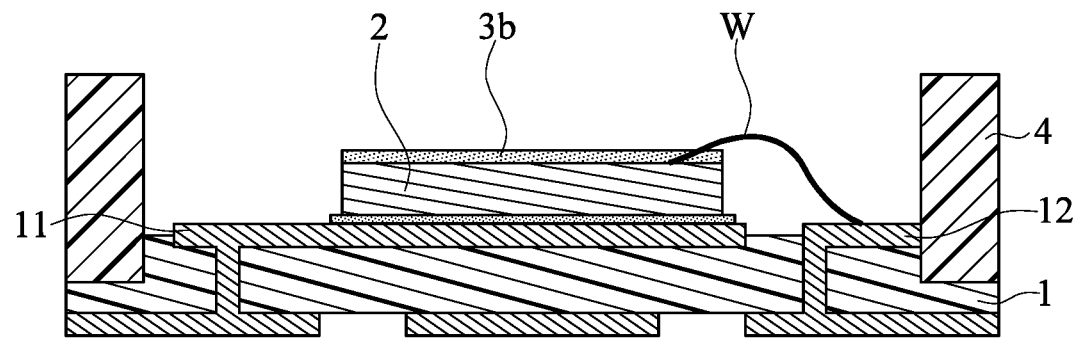
Figure 11:
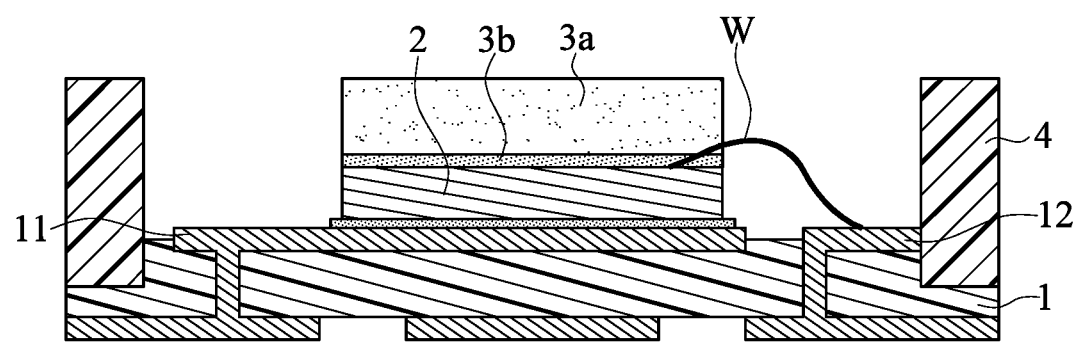
Figure 12:
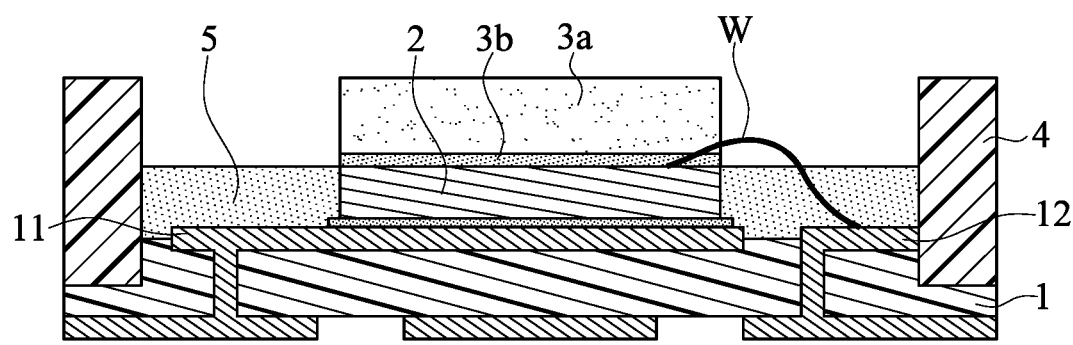
Figure 13:
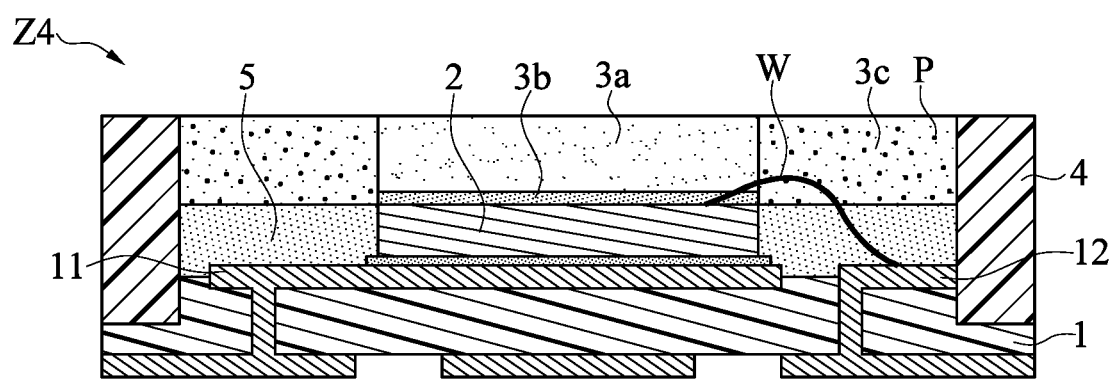

Referring to FIG. 6 and FIG. 7, which is to be read in conjunction with FIG. 5, a fifth embodiment of the present disclosure provides a light sensing module Z5 having a structure that is the same as the structure of the light sensing module Z4 of the fourth embodiment. The main difference between the fourth and fifth embodiments is that the third light-transmissive component 3c contains light diffusing particles P.

In the present embodiment, the light diffusing particles P can result in a scattering effect of a working light beam L2, and a resulting scattered light beam L21 is able to be received by the upper light receiving surface 201 or the lateral surface 202 of the light sensing unit 2, as shown in FIG. 7. As a result, the sensing range of the light sensing unit 2 can also be increased, thereby increasing sensing sensitivity. In practice, the light diffusing particles P can be inorganic particles, and preferably titanium dioxide particles. In consideration of processability and sensing efficiency, the light diffusing particles P have an average particle diameter between 10 nm and 30 nm, and are present in an amount between 0.01 wt % and 1 wt % based on 100 wt % of the third light-transmissive component 3c. The above-described details are merely exemplary, and are not intended to limit the present disclosure. For example, the first light-transmissive component 3a can also contain light diffusing particles depending on particular implementations.

Referring to FIG. 8 to FIG. 13, the light sensing module Z5 of this embodiment can be manufactured by the following steps. Firstly, a substrate 1 is provided, having a first contact pad 11 and a second contact pad 12 that is separate from the first contact pad 11, and a blocking wall 4 that is formed on the substrate 1. Next, a light sensing unit 2 is attached to the first contact pad 11 of the substrate 1, and a wire W is used to connect the light sensing unit 2 to the second contact pad 12 of the substrate 1. Next, a first light-transmissive component 3a and a second light-transmissive component 3b are formed on the light sensing unit 2, in which the second light-transmissive component 3b is formed between the light sensing unit 2 and the first light-transmissive component 3a. Then, a light shielding layer 5 is formed between the light sensing unit 2 and the blocking wall 4. Lastly, a third light-transmissive component 3c with light diffusing particles P is formed on the light shielding layer 5 to surround the first light-transmissive component 3a. The technical details of each step have been described in the aforesaid embodiments, and will not be reiterated herein.

Figure 14:
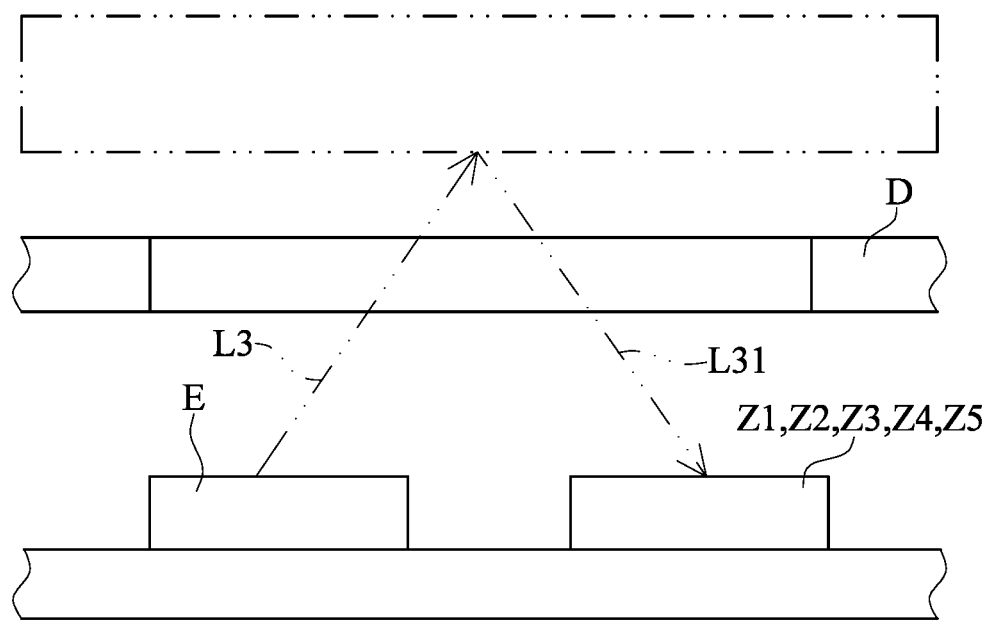
FIG. 14 is a structural schematic view of an electronic device of the present disclosure.

Referring to FIG. 14, the present disclosure further provides an electronic device D, which includes a light emitting module E and a light sensing module Z1, Z2, Z3, Z4, Z5 having the structure as described above. The light emitting module E is configured to emit a working light beam L3. The light sensing module Z1, Z2, Z3, Z4, Z5 is configured to sense an intensity of the working light beam. More specifically, the electronic device D of the present disclosure can serve as a wearable electronic device. When the working light beam L3 emitted from the light emitting module E is projected onto an object Z such as a part of a user's body, a reflected light beam L31 is formed and enters into the light sensing module Z1, Z2, Z3, Z4, Z5 to be received by the light sensing unit 2. Accordingly, the electronic device D can determine whether or not to start measuring a user's physiological signal according to the magnitude of a current generated by the light sensing unit 2.

Beneficial Effects of the Embodiments

In conclusion, the light sensing module of the present disclosure, in which the first light-transmissive component covers the light sensing unit and has a first refractive index that is between a refractive index of the light sensing unit and a refractive index of air, and the blocking wall is disposed on the substrate and surrounds the light sensing unit and the first light-transmissive component, has the following beneficial effects. The sensing range can be expanded, the blind spot can be reduced, and the crosstalk of external lights on the light sensing unit can be reduced.

Furthermore, the first light-transmissive component, the combination of the first light-transmissive component and the second light-transmissive component, or the combination of the first light-transmissive component, the second light-transmissive component, and the third light-transmissive component can realize a refractive index matching function individually or jointly to further increase the sensitivity of the light sensing unit.

In addition, the light shielding layer can work with the blocking wall to jointly realize an external light shielding function. Therefore, the crosstalk of external lights on the light sensing unit can be decreased to greatly reduce misjudgment rate.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The above beneficial effects can be verified from the performance test results as shown in Table 1:

TABLE 1

| Optical design | | $I_S$ (μA) | $I_S$ (μA %) | $I_D$ (nA) | $I_D$ (nA %) |
|---|---|---|---|---|---|
| Comparative Example | Package | 25 | 100 | 10 | 100 |
| Example 1 | First light-transmissive component and Blocking wall | 25 | 100 | 8 | 80 |
| Example 2 | First light-transmissive component, Second light-transmissive component, and Blocking wall | 26 | 104 | 8 | 80 |
| Example 3 | First light-transmissive component, Second light-transmissive component, Blocking wall, and Light shielding layer | 26 | 104 | 6 | 60 |
| Example 4 | First light-transmissive component, Second light-transmissive component, Third light-transmissive component, Blocking wall, and Light shielding layer | 27.75 | 111 | 6 | 60 |
| Example 5 | First light-transmissive component, Second light-transmissive component, Third light-transmissive component with light diffusing particles, Blocking wall, and Light shielding layer | 28.75 | 115 | 6 | 60 |

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light sensing module, comprising:
   a substrate;
   a light sensing unit being disposed on the substrate to sense an intensity of a working light beam and having an upper light receiving surface and a lateral surface perpendicular to the upper light receiving surface;
   a first light-transmissive component covering the light sensing unit, wherein the first light-transmissive component has a first refractive index that is between a refractive index of the light sensing unit and a refractive index of air; and
   a light shielding layer being disposed on the substrate and surrounding the lateral surface;
   wherein the upper light receiving surface is exposed from the light shielding layer, and the first light-transmissive component covers the upper light receiving surface and the light shielding layer.

2. The light sensing module according to claim 1, further comprising a blocking wall being disposed on the substrate and surrounding the light sensing unit and the first light-transmissive component, wherein the lateral surface and the blocking wall have a gap therebetween that is filled with the light shielding layer.

3. The light sensing module according to claim 2, wherein an upper surface of the light shielding layer is flush with the upper light receiving surface.

4. The light sensing module according to claim 2, wherein the blocking wall has a light transmittance of less than 2% with respect to the working light beam.

5. The light sensing module according to claim 2, wherein the blocking wall has a thickness between 50 μm and 200 μm.

6. The light sensing module according to claim 1, further comprising a second light-transmissive component being disposed between the light sensing unit and the first light-transmissive component and having a second refractive index between the refractive index of the light sensing unit and the first refractive index.

7. The light sensing module according to claim 6, wherein the first light-transmissive component has a thickness between 30 μm and 50 μm, and the second light-transmissive component has a thickness between 10 μm and 30 μm.

8. The light sensing module according to claim 6, wherein the first refractive index of the first light-transmissive component is between 1.45 and 1.5, and the second refractive index of the second light-transmissive component is between 1.54 and 1.55.

9. The light sensing module according to claim 1, wherein the light shielding layer has a light transmittance of less than 2% with respect to the working light beam.

10. An electronic device, comprising a light emitting module and the light sensing module as claimed in claim 1, wherein the light emitting module is configured to emit a working light beam, and the light sensing module is configured to sense an intensity of the working light beam.

11. A light sensing module, comprising:
a substrate;
a light sensing unit being disposed on the substrate to sense an intensity of a working light beam and having an upper light receiving surface and a lateral surface perpendicular to the upper light receiving surface;
a first light-transmissive component covering the light sensing unit, wherein the first light-transmissive component has a first refractive index that is between a refractive index of the light sensing unit and a refractive index of air;
a light shielding layer being disposed on the substrate and surrounding the lateral surface; and
a third light-transmissive component surrounding the first light-transmissive component and having a third refractive index that is less than the first refractive index;
wherein the upper light receiving surface is exposed from the light shielding layer, the first light-transmissive component covers the upper light receiving surface, and the third light-transmissive component covers the light shielding layer.

12. The light sensing module according to claim 11, wherein the third light-transmissive component has a thickness between 10 μm and 30 μm.

13. The light sensing module according to claim 12, wherein the third refractive index of the third light-transmissive component is between 1.35 and 1.45.

14. The light sensing module according to claim 12, wherein the third light-transmissive component contains light diffusing particles.

15. The light sensing module according to claim 14, wherein the light diffusing particles have an average particle diameter between 10 nm and 30 nm, and are present in an amount between 0.01 wt % and 1 wt % based on 100 wt % of the third light-transmissive component.

16. The light sensing module according to claim 1, wherein the light sensing unit has a first electrode at a bottom portion thereof and a second electrode at a top portion thereof, the substrate has a first contact pad and a second contact pad that are separate from each other, the first electrode is bonded to the first contact pad, and the second electrode is electrically connected to the second contact pad via a wire.

* * * * *